(12) United States Patent
Willcocks et al.

(10) Patent No.: US 8,761,325 B2
(45) Date of Patent: Jun. 24, 2014

(54) DIGITAL RECEIVERS

(76) Inventors: Ben Willcocks, Bristol (GB); Chris Born, Bristol (GB); Miguel Marquina, Bristol (GB); Andrew Sharratt, Bristol (GB); Allard Van Der Horst, Monmouthshire (GB)

( * ) Notice: Subject to any disclaimer, the term of this patent is extended or adjusted under 35 U.S.C. 154(b) by 544 days.

(21) Appl. No.: 12/825,016

(22) Filed: Jun. 28, 2010

(65) Prior Publication Data

US 2011/0317789 A1 Dec. 29, 2011

(51) Int. Cl.
*H04L 7/00* (2006.01)

(52) U.S. Cl.
USPC ........... 375/355; 375/340; 375/371; 375/227; 375/228; 714/700; 714/707

(58) Field of Classification Search
CPC . H04L 7/033; H04L 25/03057; H04L 25/063; H04L 1/205; H04L 1/20; H04L 7/007; H04L 7/06; H03L 7/081
USPC ......... 375/317, 355, 360, 362, 373, 340, 371, 375/226–228; 707/700, 707
See application file for complete search history.

(56) References Cited

U.S. PATENT DOCUMENTS

| | | | |
|---|---|---|---|
| 4,789,994 A * | 12/1988 | Randall et al. | 375/233 |
| 5,896,391 A * | 4/1999 | Solheim et al. | 714/704 |
| 6,084,931 A | 7/2000 | Powell, II et al. | |
| 6,178,213 B1 * | 1/2001 | McCormack et al. | 375/355 |
| 6,621,861 B1 * | 9/2003 | Shen | 375/226 |
| 6,757,327 B1 * | 6/2004 | Fiedler | 375/232 |
| 6,930,628 B2 * | 8/2005 | Reinhold et al. | 341/155 |
| 7,362,837 B2 * | 4/2008 | Jaussi et al. | 375/360 |
| 7,640,463 B2 * | 12/2009 | Windler et al. | 714/707 |
| 7,643,576 B2 * | 1/2010 | Lai et al. | 375/317 |
| 7,721,134 B2 * | 5/2010 | Cranford et al. | 713/400 |
| 7,864,907 B2 * | 1/2011 | Streibl et al. | 375/355 |

(Continued)

FOREIGN PATENT DOCUMENTS

| | | |
|---|---|---|
| EP | 0415108 A2 | 3/1991 |
| GB | 2397982 | 8/2004 |

(Continued)

OTHER PUBLICATIONS

Agilent "Eye Diagram Measurements in Advanced Design System", 2008, pp. 1-42.*

(Continued)

*Primary Examiner* — Sophia Vlahos
(74) *Attorney, Agent, or Firm* — TIPS Group

(57) ABSTRACT

A clock generator generates a clock signal used for sampling a received signal by a comparator which compares the received signal to a reference. A phase shifter adjusts the phase of the first clock signal and a controller adjusts the phase of the clock signal to maximize the vertical eye opening of the signal at the sampling time. In an example embodiment, the phase of the clock signal is adjusted in a first direction and a measure of vertical eye opening of the signal is compared to a previous measure. If the measure of vertical eye opening has increased the signal another phase adjustment is made in the same direction and if the vertical eye opening of the signal has decreased a further phase adjustment in the opposite direction is made. By increasing the vertical eye opening of the signal the signal-to-noise ratio of the received signal is improved.

6 Claims, 4 Drawing Sheets

(56) References Cited

U.S. PATENT DOCUMENTS

| | | | |
|---|---|---|---|
| 7,957,462 B2 * | 6/2011 | Aboujaoude et al. | 375/226 |
| 8,081,723 B1 * | 12/2011 | Ding et al. | 375/355 |
| 8,126,039 B2 * | 2/2012 | Mobin et al. | 375/224 |
| 8,238,503 B2 * | 8/2012 | Noguchi | 375/371 |
| 8,238,504 B2 * | 8/2012 | Tomita et al. | 375/371 |
| 8,407,511 B2 * | 3/2013 | Mobin et al. | 713/500 |
| 2004/0146119 A1 * | 7/2004 | Weiner et al. | 375/317 |
| 2005/0259764 A1 * | 11/2005 | Hung Lai et al. | 375/317 |
| 2008/0005629 A1 * | 1/2008 | Windler et al. | 714/712 |
| 2008/0152057 A1 * | 6/2008 | Lee et al. | 375/355 |
| 2009/0154626 A1 * | 6/2009 | Anderson et al. | 375/360 |
| 2010/0054383 A1 * | 3/2010 | Mobin et al. | 375/371 |
| 2010/0329322 A1 * | 12/2010 | Mobin et al. | 375/231 |

FOREIGN PATENT DOCUMENTS

| | | |
|---|---|---|
| WO | 02/30035 A1 | 4/2002 |
| WO | 02/091582 A1 | 11/2002 |
| WO | 2010/071977 A1 | 7/2010 |

OTHER PUBLICATIONS

Agilent "Eye Diagram Measurements in Advanced Design System", pp. 1-42, 2008.*

Great Britain Search Report for Application No. GB1010850.4.

* cited by examiner

DIGITAL RECEIVERS

The present invention relates to methods and apparatus for receiving digital data signals and especially to methods and apparatus for identifying the bits in a received signal.

In a conventional binary, serial data link between a transmitter and a receiver each 'bit' of information is encoded by the transmitter as the polarity of the signal. Depending on the nature of the transmitter and the receiver the signal which is transmitted may, for instance, be an electrical signal or optical signal and the signal may be transmitted via any suitable channel, for example via free space or via a suitable guide medium such as a conductive wire or fibre optic cable. The data is transmitted at a fixed rate, with each data bit occupying a period of time equal to the bit period. The receiver is required to determine the polarity of each bit received in order to correctly recover the data sequence. A simple receiver will have a single threshold placed half way between the average '1' level and the average '0' level.

Some digital data streams, especially high-speed serial data streams are sent without an accompanying clock signal. The receiver generates a clock from an approximate frequency reference, and then phase-aligns to the transitions in the data stream with a phase-locked loop (PLL). This process is commonly known as clock and data recovery (CDR).

A phase-locked loop or phase lock loop (PLL) is a control system that tries to generate an output signal whose phase is related to the phase of the input signal. A phase-locked loop circuit compares the phase of the input signal with a phase signal derived from its output oscillator signal and adjusts the frequency of its oscillator to keep the phases matched. The recovered clock determines the times at which the received signal is sampled and quantized.

The common approach to the PLL is to use it to generate a local clock aligned to the transitions in the data. This is shifted by 180 degrees (typically by means of a simple inversion) to provide the clock for sampling the input signal, such that the sampling time is midway between the transition times.

A sampling time midway between the transition times, i.e. in the middle of the bit period, is generally used.

The present invention provides an improved method for sampling received data.

Thus according to the present invention there is provided a method of processing a received digital signal comprising the steps of: generating a first clock signal for sampling the received signal each bit period and adjusting the phase of the first clock signal to maximize the vertical eye opening of the signal at the sampling time.

As will be explained in more detail below the vertical eye opening of a signal is an indication of the extent of difference between the signal values of the bits of opposite polarity in the signal. In other words the gap between the signal values that represent a binary 1 and the signal values that represent a binary 0. By overlaying the signal values of a plurality of bits on the same graph an 'eye' diagram can be produced. The vertical extent of the eye opening, the gap between the signal levels of the 1s and 0s is indicative of the signal to noise ratio of the signal. Ideally the signal should be compared to a reference level, to determine the polarity, i.e. whether it is a 1 or a 0, at the point of greatest eye opening. This is conventionally taken to be the midpoint of the bit period as determined in clock recovery. However, various channel effects may mean that the midpoint is not actually the best place to sample the signal. The method of the present invention determines substantially when the maximum eye opening occurs and samples at that time. The method may therefore involve estimating the vertical eye opening of the received signal.

The method may be iterative and may comprises the steps of measuring the vertical eye opening of the signal at a first phase of the first clock signal, making an adjustment to the phase of the first clock signal and determining whether the vertical eye opening has increased or decreased. If the vertical eye opening has increased the method is repeated with an another adjustment to the phase in the same direction, i.e. if a phase delay was increased the delay is increased further, if a phase delay was reduced it is reduced further. If however the eye opening reduces as a result of the phase adjustment the method is repeated with an adjustment to the phase in the opposite direction, i.e. if the initial adjustment was to increase a delay the next adjustment is to reduce it. In this way the phase is iteratively adjusted to find the position of maximum eye opening.

The invention also provide an apparatus for sampling a received digital data signal comprising:

a clock generator for generating a first clock signal for sampling the signal, a comparator for comparing the received signal to a reference a phase shifter for adjusting the phase of the first clock signal; and a controller configured to adjust the phase of the first clock signal to maximize the vertical eye opening of the signal at the sampling time.

The invention will now be described by way of example only with respect to the following drawings, of which:

Figure 1:
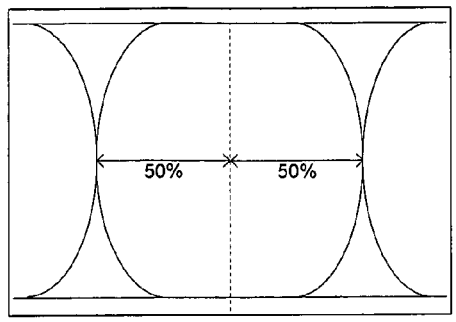
FIG. 1 shows a symmetrical eye where the optimum sampling point is at the mid-point (in time) between the points with the highest crossing density.

FIG. 1 shows an eye diagram for a received digital data signal. An eye diagram may be plotted by showing the signal evolution over a bit period for at least one signal representing a binary 1 with at least one signal representing a binary 0. FIG. 1 shows a idealized eye diagram where the eye described by the evolution of the signal values is symmetrical.

A digital receiver will generally compare the received signal to a reference level in order to determine the polarity of a particular bit. The comparison is clocked at a particular time and the result is used as the indication of the polarity of that bit.

Figure 2:
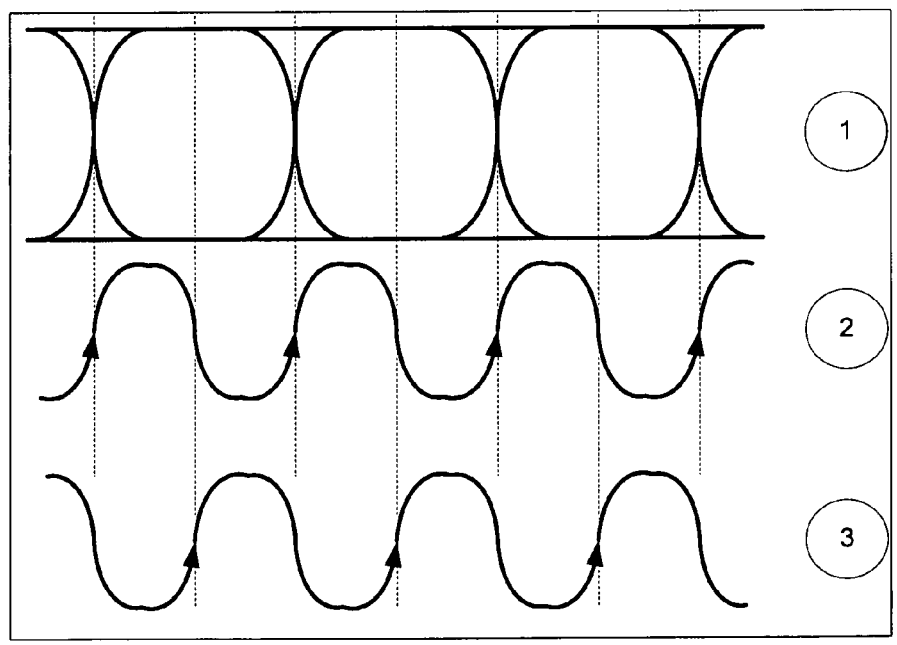
FIG. 2 illustrates a conventional approach for clock recovery.

In some data signals the data signal is received without a clock signal and so the clock signal needs to be recovered from the received data, for example using a phase locked loop. FIG. 2 illustrates the principle. A clock signal 2 is aligned with transitions in the received data 1 so as to provide an aligned clock signal. This is then usually phase shifted by 180° to provide a phase shifted clock signal 3 which can be used to clock the output of the comparison step. This ensures that the signal is sampled at the mid-point of the bit period.

When the data signal is symmetrical, the mid-point also represents the point with the largest vertical eye opening. Assuming the noise on the signal is uncorrelated to the data pattern, the point with the largest vertical eye opening will also represent the sampling point where the signal-to-noise ratio is the highest. Sampling data at this point will result in the lowest error-rate and the best quality signal.

Figure 3:
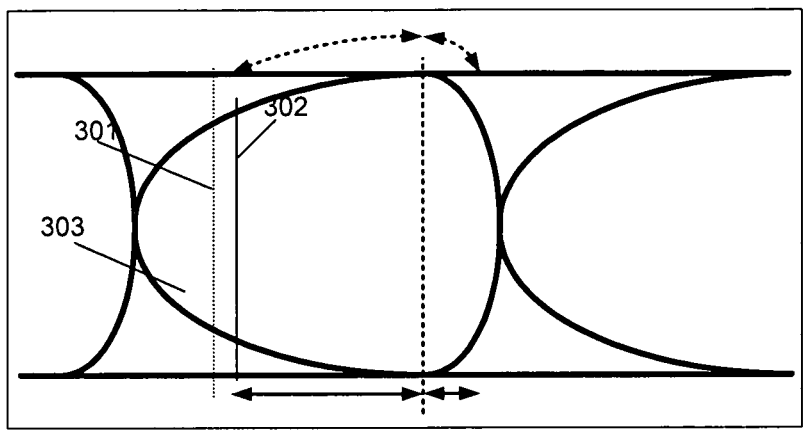
FIG. 3 shows how a phase dither is used to determine the optimum phase location for maximum eye opening at the sampling time.

However in some instances, noise and other channel effects, may result in a received signal where the eye diagram is not symmetrical. FIG. 3 illustrates an eye diagram wherein the signal evolution, i.e. the eye is not symmetrical. When the eye is not symmetrical, sampling at the mid-point between transitions may not represent the point with the largest vertical eye opening.

The present invention finds the sampling point with the largest vertical eye opening, independent from the eye crossing points.

In an embodiment of the present invention an adjustable phase shifter is used to adjust the phase of the clock signal used to sample the received signal. The phase shifter is controlled to adjust the phase shift in order to minimize the bit error rate.

Figure 5:
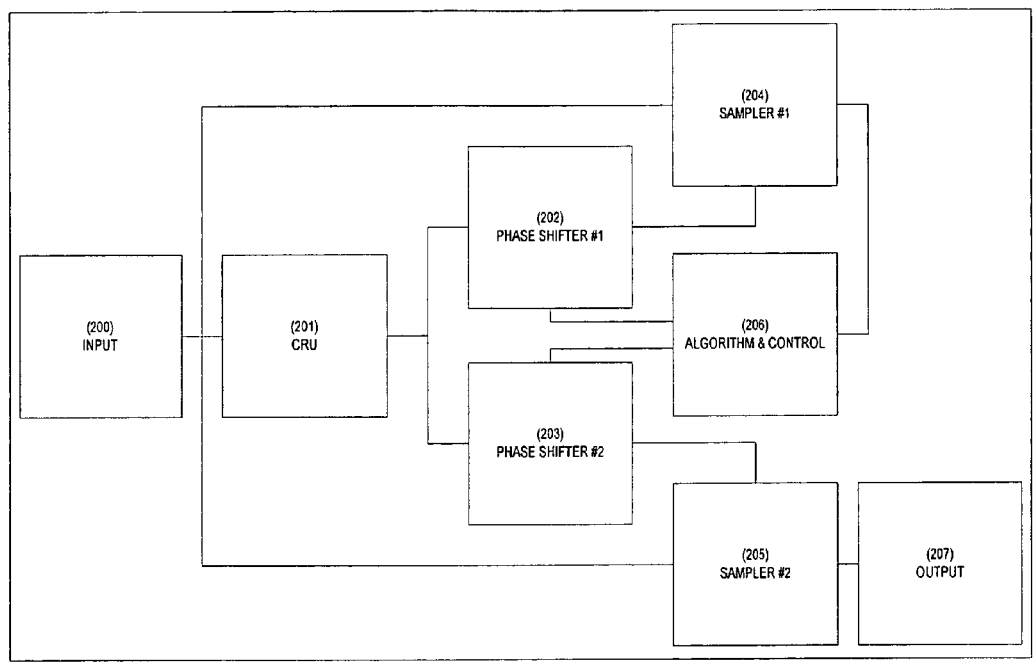
FIG. 5 shows the implementation of the invention, using 2 separate phase shifters.

Referring to FIG. 5, this shows an apparatus diagram according to this invention. Data is received at input 200, and provided to the Clock Recovery Unit (CRU, 201) and two samplers 204 and 205. The first sampler 204 uses the recovered clock as shifted by a first phase shifter 202 while the second sampler uses the recovered clock as shifted by a second phase shifter 203. The output of the first sampler 204 is used by a control module 206 to control the algorithm 206, which determines where the largest eye opening is located. The output of the second sampler 205, which samples the received data at the point with the largest eye opening, is provided to the system output 207.

As the phase of the clock signal used for sampling is automatically adjusted it is not necessary to guarantee accurate phase alignment between the phase detector of the phase-locked loop and the quantizers of the receiver, across all corners of operation e.g. from one chip to another and/or across the range of operating temperatures. At high data rates, this is difficult to achieve. Thus the method relaxes the operating constraints on the receiver.

Further to minimize bit error rate, it is desirable to sample at the point of maximum vertical eye opening. Phase-locked loops typically provide a clock which is centered on the horizontal eye opening. Depending on the characteristics of the channel, it is quite common for the eye opening to be asymmetrical, so that the maximum vertical opening does not occur at this point.

The phase algorithm makes use of an estimate of vertical inner eye opening, which is obtained by determining the 45th and 55th percentile levels, i.e. a first level at which 45 percent of the signal values are below the first level and a second level at which 55 percent of the signal values are below the level. The 45th percentile is towards the top end of the distribution of zeros, and the 55th percentile is towards the bottom end of the distribution of ones. Therefore, the distance between these two points constitutes an estimation of inner eye opening. These exact percentiles need not be used and other percentiles may be used in other cases, but it is desirable not to be too close to the 50th percentile in order to be able to tolerate small disparities in the transmitted bit sequence (that is, small imbalances between the number of ones and number of zeros).

The phase algorithm operates at a fixed period during which a plurality of bits are detected. At the end of each period, the eye opening is compared with the eye opening at the end of the previous period. If the eye opening has increased, then the phase is advanced in the same direction as it was advanced last time. On the other hand, if the eye opening has decreased, then the phase is advanced in the opposite direction to that which was used last time. This algorithm has the effect of settling at an eye opening maximum, though even when settled it will of course continue to dither around the settling point.

Referring to FIG. 3 suppose that line 301 indicates the current sampling period. If the phase of the clock signal is adjusted to sample instead at time 302 it will be seen that the vertical eye opening decreases. Therefore the phase will adjusted in the other direction. If the phase is adjusted to time 303 this will show an increase in the vertical eye opening. Further adjustment will therefore be made in this direction until the eye opening again decreases.

The graph of eye opening as a function of phase is normally monotonic, but depending on the characteristics of the channel it can be non-monotonic, which gives rise to the possibility that the phase algorithm will settle at a local maximum, but not the overall maximum. To avoid this problem, an initial sweep is made over the full range of phase, and the location of the largest eye opening is noted. Operation of the phase algorithm is then started from this point. Subsequently the phase algorithm will track any slow variations without danger of becoming stuck at a local maximum.

It should be noted that it is generally only acceptable to perform the phase sweep at start-up, since it inevitably causes errors in the received data. The phase algorithm, on the other hand, only dithers the phase by small amounts, and can therefore run continuously without affecting the bit error rate unduly.

Figure 4:
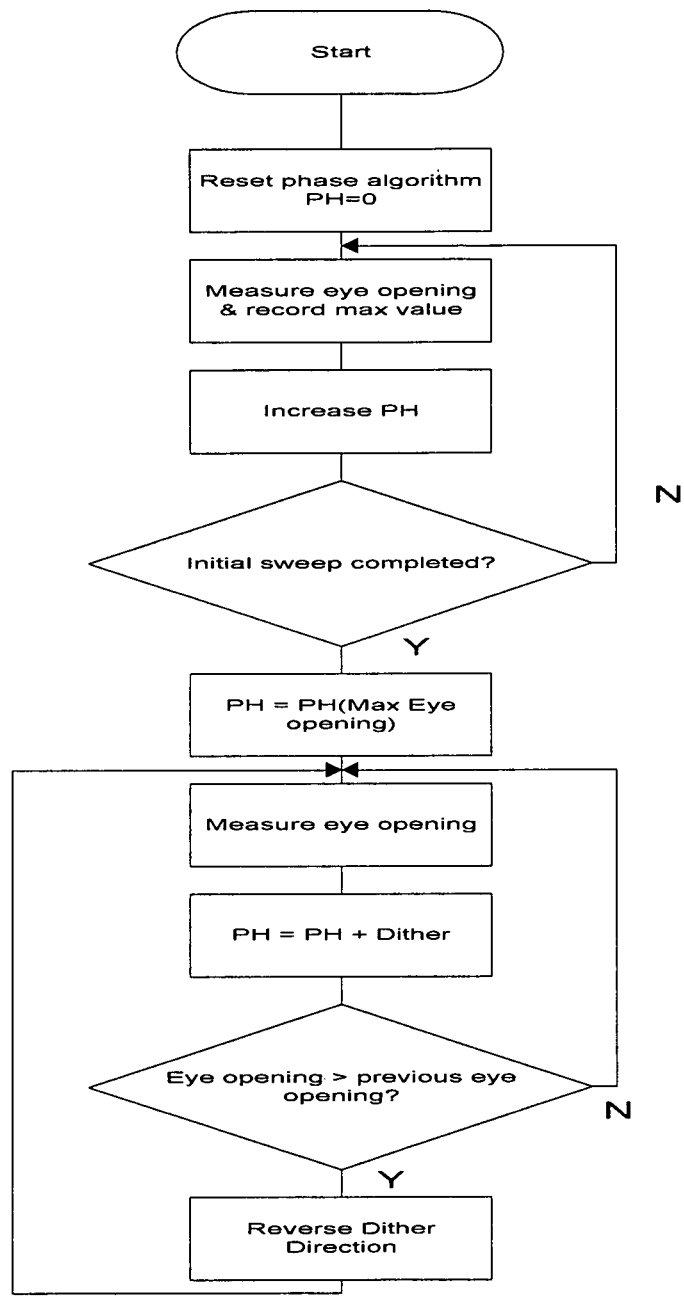
FIG. 4 shows the general flow diagram of the optimized phase algorithm.

FIG. 4 illustrates a flow chart of the method of operation according to the present invention.

Referring again to FIG. 5, the dither introduced by the phase algorithm 206 inevitably increases the clock jitter. In order to minimize the clock jitter at the output 207 of the receiver, the output signal may be retimed to a separate clock, produced by a second phase shifter 203. At the end of the initial sweep, both phase shifters 202 and 203 are set to the phase corresponding to maximum eye opening. In normal operation, the second phase shifter 203 remains at this setting, and consequently does not contribute to output jitter. However, it is necessary that the settings of the two phase shifters 202 and 203 do not deviate excessively from each other, otherwise bit errors would be introduced. For this reason, it may occasionally be necessary to adjust the second phase shifter 203 if there has been a significant change in the range over which the main phase shifter 202 is dithering. A simple hysteresis algorithm may be used to determine when adjustments in the setting of the second phase shifter 203 are required.

The invention claimed is:

1. An apparatus for sampling a received digital data signal comprising:
   a clock generator to generate a clock signal having a phase;
   a first phase shifter coupled to the clock generator to continuously adjust the phase of the clock signal;
   a first sampler coupled to the first phase shifter to sample the received signal responsive to the clock signal as phase-adjusted by the first phase shifter;
   a controller coupled to the first sampler and configured to dither the phase of the clock signal to dynamically maximize the vertical eye opening of the received signal at a sampling time, wherein the controller is configured to determine the vertical eye opening by determining a first signal value that a first predetermined proportion of samples are below and a second signal value that a second predetermined proportion of signal values are below and determine the difference between the first and second signal values;
   a second phase shifter coupled to the clock generator to adjust the phase of the clock signal; and a second sampler coupled to the second phase shifter to sample the received signal responsive to the clock signal as phase-adjusted by the second phase shifter at the sampling time when the vertical eye opening is maximized to produce an output signal.

2. An apparatus as claimed in claim 1 wherein the first predetermined proportion is about 55% and the second predetermined proportion is about 45%.

3. An apparatus as claimed in claim 1 wherein the controller is configured, in an initialization mode, to control the first phase shifter to sweep the phase of the clock signal through all phase values, to determine an initial indication of maximum vertical eye opening and to control the first phase shifter to adjust the phase of the clock signal to the phase that corresponds to maximum vertical eye opening.

4. An apparatus as claimed in claim 1 further comprising a phase locked loop which is initially phase matched to the clock signal.

5. An apparatus as claimed in claim 1 wherein the controller is configured to compare the received signal to a reference to determine a polarity of the received signal.

6. An apparatus as claimed in claim 1 wherein the output signal is retimed to a separate clock signal produced by the second phase shifter in order to minimize clock jitter.

\* \* \* \* \*